(12) United States Patent
Guo et al.

(10) Patent No.: US 10,048,550 B2
(45) Date of Patent: Aug. 14, 2018

(54) DRIVER CHIP STRUCTURE AND LIQUID CRYSTAL DISPLAY DEVICE

(71) Applicants: Shenzhen China Star Optoelectronics Technology Co., Ltd., Shenzhen, Guangdong (CN); Wuhan China Star Optoelectronics Technology Co., Ltd., Wuhan, Hubei (CN)

(72) Inventors: Chunpeng Guo, Guangdong (CN); Jiehui Qin, Guangdong (CN); Xiang Yang, Guangdong (CN)

(73) Assignees: Shenzhen China Star Optoelectronics Technology Co., Ltd, Shenzhen, Guangdong (CN); Wuhan China Star Optoelectronics Technology Co., Ltd, Wuhan, Hubei (CN)

( * ) Notice: Subject to any disclaimer, the term of this patent is extended or adjusted under 35 U.S.C. 154(b) by 224 days.

(21) Appl. No.: 14/901,048

(22) PCT Filed: Sep. 24, 2015

(86) PCT No.: PCT/CN2015/090525
§ 371 (c)(1),
(2) Date: Dec. 27, 2015

(87) PCT Pub. No.: WO2017/035881
PCT Pub. Date: Mar. 9, 2017

(65) Prior Publication Data
US 2017/0199414 A1 Jul. 13, 2017

(30) Foreign Application Priority Data
Sep. 6, 2015 (CN) .......................... 2015 1 0561507

(51) Int. Cl.
*G02F 1/1335* (2006.01)
*G02F 1/1345* (2006.01)

(52) U.S. Cl.
CPC ........ *G02F 1/13452* (2013.01); *G02F 1/1345* (2013.01); *G02F 1/13454* (2013.01); *G02F 1/13458* (2013.01); *G02F 2001/13456* (2013.01)

(58) Field of Classification Search
CPC ............. G02F 1/13458; G02F 1/13452; G02F 1/1345; G02F 1/13454; G02F 2001/13456
See application file for complete search history.

(56) References Cited

U.S. PATENT DOCUMENTS

| 2002/0109227 | A1 | 8/2002 | Liu et al. | |
| 2008/0123041 | A1* | 5/2008 | Fujita | H05K 3/323 349/152 |
| 2016/0306213 | A1* | 10/2016 | Lee | G02F 1/13452 |

FOREIGN PATENT DOCUMENTS

| CN | 101192584 A | 6/2008 |
| CN | 102117788 A | 7/2011 |

(Continued)

*Primary Examiner* — Dung Nguyen
(74) *Attorney, Agent, or Firm* — Andrew C. Cheng

(57) ABSTRACT

The present invention provides a driver chip structure, and the driver chip structure comprises a substrate and a plurality of connection bumps which are located on the substrate and equal in size, and the substrate comprises a surface, and the plurality of connection bumps are spaced and aligned on the surface in array, and sectional appearances of the connection bumps parallel with the surface are trapezoids or triangles. The present invention also discloses a liquid crystal display device.

5 Claims, 2 Drawing Sheets

(56) References Cited

FOREIGN PATENT DOCUMENTS

CN 103390608 A 11/2013
JP 2001-358165 * 12/2001

* cited by examiner

DRIVER CHIP STRUCTURE AND LIQUID CRYSTAL DISPLAY DEVICE

CROSS REFERENCE

This application claims the priority of Chinese Patent Application No. 201510561507.9, entitled "Driver chip structure and liquid crystal display device", filed on Sep. 6, 2015, the disclosure of which is incorporated herein by reference in its entirety.

FIELD OF THE INVENTION

The present invention relates to a display technology field, and more particularly to a driver chip structure and a liquid crystal display device.

BACKGROUND OF THE INVENTION

The liquid crystal display panel is the main stream flat panel display technology in the present market. The display panel comprises a display active area, a side frame area and a drive area under the side frame. The drive area is mainly meant to be a driver chip lamination area for adhering to the driver chip, which is electrically connected to the electrical device main board of a cell phone or others through a flexible printed circuit board. The flexible printed circuit board is employed to electrically connect the electrical device main board and the display panel and transmits control instructions and power supply voltages from the electrical device main board to the driver IC; the IC lamination area is employed for the lamination of the driver IC, and the driver IC provides voltages and data signals to the display panel; the panel display active area receives signals from the driver IC to show a required image. However, most of the pins of the driver IC in prior art are rectangular bumps, which are aligned in array on the surface of the driver IC substrate. The driver chip lamination area comprises ITO connection points opposite to the pins; as implementing lamination, a layer of conductive glue is utilized to align and laminate the pins onto the corresponding ITO pads. However, during the verification of panel functions and usage of the cell phone, the cell phone panel is moved a lot. Thus, the pins and the ITO pads may easily loose and the Driver IC has the potential risk of up and down movement. Once the movement occurs, it results in the abnormal work of the entire panel.

SUMMARY OF THE INVENTION

An objective of the present invention is to provide a driver chip structure and a liquid crystal display device, which can effectively prevent the looseness appearing between the driver chip and the lamination area of the liquid crystal display device.

The present invention further provides a backlight module and a display device.

For realizing the aforesaid objective, the technical solution provided by the embodiments of the present invention is:

The present invention provides a driver chip structure, and the driver chip structure comprises a substrate and a plurality of connection bumps which are located on the substrate and equal in size, and the substrate comprises a surface, and the plurality of connection bumps are spaced and aligned on the surface in array, and sectional appearances of the connection bumps parallel with the surface are trapezoids or triangles.

The surface comprises two lateral sides which are opposite and parallel with each other, and the sectional appearances of the connection bumps are trapezoids, and the trapezoids comprise upper base sides and lower base sides, and the lower base sides of the connection bumps are located to face the lateral sides.

The surface comprises two lateral sides which are opposite and parallel with each other, and the sectional appearances of the connection bumps are trapezoids, and the trapezoids comprise upper base sides and lower base sides, and one column of the connection bumps adjacent to one of the lateral sides are alternately aligned in form of normal trapezoids and obtrapezoids, wherein the lower base sides of the normal trapezoids face the lateral side adjacent to the connection bumps, and the upper base sides of the obtrapezoids face the lateral side adjacent to the connection bumps.

The surface comprises two lateral sides which are opposite and parallel with each other, and the sectional appearances of the connection bumps are triangles, and longer sides of the triangles face to the lateral sides.

The substrate and the connection bumps are electrically connected.

The present invention provides a liquid crystal display device, comprising a liquid crystal panel, a lamination area and a driver chip structure, and the driver chip structure comprises a substrate and a plurality of connection bumps which are located on the substrate and equal in size, and the substrate comprises a surface, and the plurality of connection bumps are spaced and aligned on the surface in array, and sectional appearances of the connection bumps parallel with the surface are trapezoids or triangles; the lamination area comprises ITO connection points opposite to the connection bumps, and the ITO connection points are fixed and conducted with the connection bumps.

The liquid crystal panel comprises a display area and a frame area at periphery of the display area, and the lamination area is inside the frame area.

The liquid crystal display device further comprises a flexible printed circuit board, and the flexible printed circuit board is electrically connected to the substrate of the driver chip structure.

The surface comprises two lateral sides which are opposite and parallel with each other, and the sectional appearances of the connection bumps are trapezoids, and the trapezoids comprise upper base sides and lower base sides, and the lower base sides of the connection bumps are located to face the lateral sides.

The surface comprises two lateral sides which are opposite and parallel with each other, and the sectional appearances of the connection bumps are trapezoids, and the trapezoids comprise upper base sides and lower base sides, and one column of the connection bumps adjacent to one of the lateral sides are alternately aligned in form of normal trapezoids and obtrapezoids, wherein the lower base sides of the normal trapezoids face the lateral side adjacent to the connection bumps, and the upper base sides of the obtrapezoids face the lateral side adjacent to the connection bumps.

The driver chip structure of the present invention locates the non-rectangular connection bumps aligned in certain arrangement rules to be laminated with the ITO connection points. The sections of the connection bumps can promote the stability of the lamination, and thus can prevent the looseness appearing between the driver chip and the lamination area of the liquid crystal display device.

BRIEF DESCRIPTION OF THE DRAWINGS

In order to more clearly illustrate the embodiments of the present invention, the following figures will be described in the embodiments are briefly introduced. It is obvious that the drawings are only some embodiments of the present invention, those of ordinary skill in this field can obtain other figures according to these figures without paying the premise.

DETAILED DESCRIPTION OF PREFERRED EMBODIMENTS

For better explaining the technical solution and the effect of the present invention, the present invention will be further described in detail with the accompanying drawings in the specific embodiments.

Figure 1:
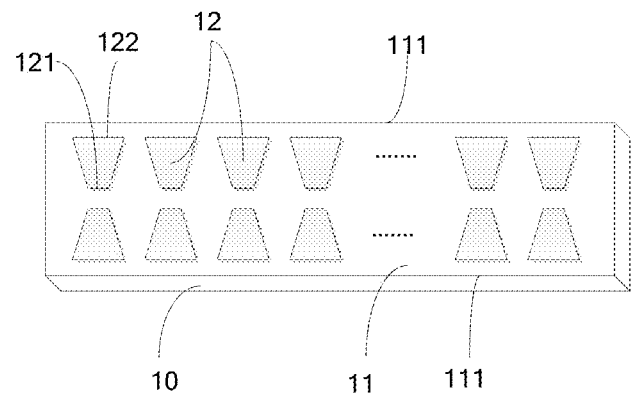
FIG. 1 is a diagram of a driver chip in the preferred embodiment of the present invention.

Please refer to FIG. 1. The preferred embodiment of the present invention provides a driver chip structure, comprising a substrate 10 and a plurality of connection bumps 12 which are located on the substrate 10 and equal in size. The substrate comprises a surface 11, and the plurality of connection bumps 12 are spaced and aligned on the surface 11 in array, and sectional appearances of the connection bumps 12 parallel with the surface 11 are trapezoids or triangles. In this embodiment, the sectional appearances of the plurality of connection bumps 12 are trapezoids. Furthermore, the surface 11 comprises two lateral sides 111 which are opposite and parallel with each other, and the trapezoids comprise upper base sides 121 and lower base sides 122, and the lower base sides 122 of the connection bumps 12 are located to face the lateral sides 111. The substrate 10 and the connection bumps 12 are electrically connected.

Specifically, the substrate 10 is a rectangular plate body, which is equivalent to a small printed circuit board and there are wirings and other electrical components inside. The connection bumps 12 are metal welding points which are equivalent to pins of the printed circuit board. The connection bumps 12 and wirings inside the substrate 10 achieve the electrical connections with the substrate 10. The sectional appearances of the connection bumps 12 are isosceles trapezoids, and a length of the upper base side 121 is smaller than a length of the lower base side 122. In this embodiment, the plurality of connection bumps 12 are aligned in two parallel columns. The Two columns are parallel with the lateral sides 111. The lower base sides 122 of the connection bumps 12 in each column face to the lateral side adjacent thereto. In other words, all the lower base sides 122 of the connection bumps 12 face the outer side of the surface. Such structure promotes the stabilities of the connections of the connection bumps and other welding points.

Figure 2:
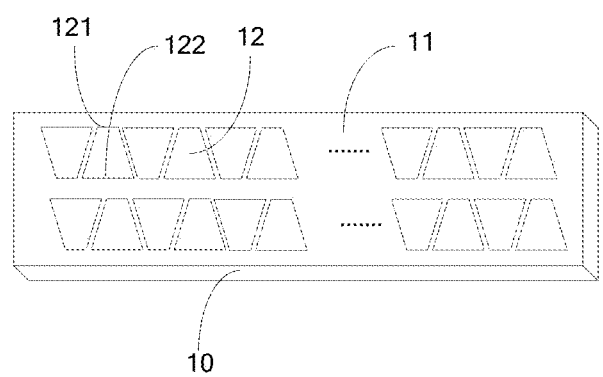
FIG. 2 is another diagram of connection bumps of a driver chip structure according to the present invention.

Please refer to FIG. 2. In another embodiment of the present invention, in which the difference from the aforesaid embodiment is that one column of the connection bumps 12 adjacent to one of the lateral sides 111 are alternately aligned in form of normal trapezoids and obtrapezoids, wherein the lower base sides 122 of the normal trapezoids face the lateral side 111 adjacent to the connection bumps 12, and the upper base sides 121 of the obtrapezoids face the lateral side 111 adjacent to the connection bumps 12. Specifically, the plurality of connection bumps 12 are aligned in two parallel columns. The Two columns are parallel with the lateral sides 111. In each column, in case that the lower base side 122 of the first connection bump 12 faces the lateral side adjacent thereto, the upper base side 121 of the second connection bump 12 faces the same lateral side 111. The lower base side 122 of the third connection bump 12 faces the lateral side again and so on. In on column, the plurality of connection bumps are alternately located in form of normal trapezoids and obtrapezoids. Such arrangement occupies less area of the surface and beneficial for the narrow frame design. Moreover, the amount of the connection bumps can be increased to increase the connection area of the connection bumps and the other welding points to ensure the connection stability.

In the third embodiment, the sectional appearances of the plurality of connection bumps 12 are triangles (not shown), and longer sides of the triangles face to the lateral sides.

Figure 3:
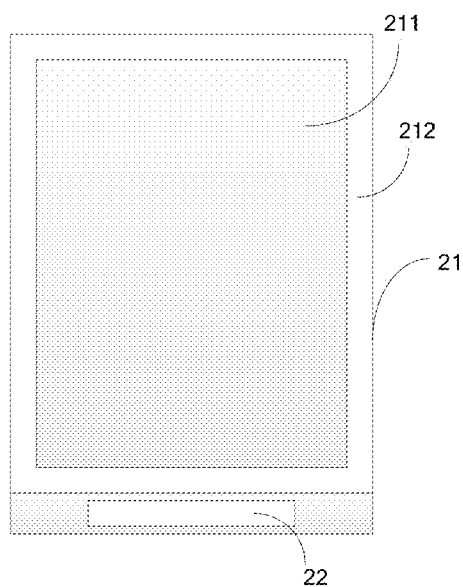
FIG. 3 is a diagram of a liquid crystal display device according to the present invention.

Please refer to FIG. 3. The present invention provides a liquid crystal display device. The liquid crystal display device comprises a liquid crystal panel 21, a lamination area 22 and the driver chip structure. The lamination area 22 comprises ITO connection points (not shown) opposite to the connection bumps, and the ITO connection points are fixed and conducted with the connection bumps.

Specifically, the liquid crystal display device is employed in the cell phone, the computer, the LCD TV and etc. The lamination area is located in the extension part of the array substrate, which specifically can be the extension part of the ITO. The ITO connection points are aligned according to the arrangement of the connection bumps 12, and are fixed and conducted with the connection bumps by adhesion.

Furthermore, the liquid crystal panel 21 comprises a display area 211 and a frame area 212 at periphery of the display area 211, and the lamination area 22 is inside the frame area 212.

Furthermore, the liquid crystal display device further comprises a flexible printed circuit board, and the flexible printed circuit board is electrically connected to the substrate of the driver chip structure. The flexible printed circuit board is also electrically connected to an electrical device main board having a display device. For example, the cell phones can be illustrated. The flexible printed circuit board transmits control instructions and power supply voltages from the electrical device main board to the driver chip structure; the driver chip structure provides voltages and data signals to the liquid crystal panel; the panel display active area receives signals from the driver chip structure to show a required image.

In the liquid crystal display device according to the present invention, the connection bumps, of which the sectional appearances are trapezoids or triangles of the driver chip structure, are fixed with the ITO connection points to promote the stability of the lamination.

Above are only specific embodiments of the present invention, the scope of the present invention is not limited to this, and to any persons who are skilled in the art, change or replacement which is easily derived should be covered by the protected scope of the invention. Thus, the protected scope of the invention should go by the subject claims.

What is claimed is:

1. A driver chip structure, wherein the driver chip structure comprises a substrate and a plurality of connection bumps which are located on the substrate and equal in size, and the substrate comprises a surface, and the plurality of connection bumps are spaced and aligned on the surface in array, and sectional appearances of the connection bumps parallel with the surface are trapezoids, wherein the surface comprises two lateral sides which are opposite and parallel with each other, and the sectional appearances of the connection bumps are trapezoids, and the trapezoids comprise upper base sides and lower base sides, and one column of the connection bumps adjacent to one of the lateral sides are alternately aligned in form of normal trapezoids and obtrapezoids, wherein the lower base sides of the normal trapezoids face the lateral side adjacent to the connection bumps, and the upper base sides of the obtrapezoids face the lateral side adjacent to the connection bumps to increase an amount of the connection bumps and a connection area of the connection bumps.

2. The driver chip structure according to claim 1, wherein the substrate and the connection bumps are electrically connected.

3. A liquid crystal display device, wherein the liquid crystal display device comprises a liquid crystal panel, a lamination area and a driver chip structure, and the driver chip structure comprises a substrate and a plurality of connection bumps which are located on the substrate and equal in size, and the substrate comprises a surface, and the plurality of connection bumps are spaced and aligned on the surface in array, and sectional appearances of the connection bumps parallel with the surface are trapezoids, wherein the surface comprises two lateral sides which are opposite and parallel with each other, and the sectional appearances of the connection bumps are trapezoids, and the trapezoids comprise upper base sides and lower base sides, and one column of the connection bumps adjacent to one of the lateral sides are alternately aligned in form of normal trapezoids and obtrapezoids, wherein the lower base sides of the normal trapezoids face the lateral side adjacent to the connection bumps, and the upper base sides of the obtrapezoids face the lateral side adjacent to the connection bumps to increase an amount of the connection bumps and a connection area of the connection bumps; the lamination area comprises ITO connection points opposite to the connection bumps, and the ITO connection points are fixed and conducted with the connection bumps.

4. The liquid crystal display device according to claim 3, wherein the liquid crystal panel comprises a display area and a frame area at periphery of the display area, and the lamination area is inside the frame area.

5. The liquid crystal display device according to claim 3, wherein the liquid crystal display device further comprises a flexible printed circuit board, and the flexible printed circuit board is electrically connected to the substrate of the driver chip structure.

* * * * *